(12) United States Patent
Lin

(10) Patent No.: US 12,513,988 B2
(45) Date of Patent: Dec. 30, 2025

(54) ELECTRONIC DEVICE AND MANUFACTURING METHOD THEREOF

(71) Applicant: Innolux Corporation, Miao-Li County (TW)

(72) Inventor: Chen-Yu Lin, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 574 days.

(21) Appl. No.: 17/892,166

(22) Filed: Aug. 22, 2022

(65) Prior Publication Data

US 2023/0103531 A1    Apr. 6, 2023

(30) Foreign Application Priority Data

Sep. 26, 2021 (CN) .......................... 202111130397.2

(51) Int. Cl.
H10D 86/60 (2025.01)
H10D 86/01 (2025.01)
H10D 86/40 (2025.01)

(52) U.S. Cl.
CPC .......... H10D 86/60 (2025.01); H10D 86/021 (2025.01); H10D 86/443 (2025.01); H10D 86/451 (2025.01)

(58) Field of Classification Search
CPC .... H10D 86/60; H10D 86/021; H10D 86/443; H10D 86/451; H10D 30/6757; H10D 30/6729
See application file for complete search history.

(56) References Cited

U.S. PATENT DOCUMENTS

2010/0133539 A1* 6/2010 Kang .................. H10D 30/673
                                                257/E21.535
2016/0300899 A1* 10/2016 Zhang ................ H10D 30/673

FOREIGN PATENT DOCUMENTS

CN            103824862          5/2014

* cited by examiner

*Primary Examiner* — Thanh T Nguyen
(74) *Attorney, Agent, or Firm* — JCIPRNET

(57) ABSTRACT

An electronic device and a manufacturing method of the electronic device are provided. The electronic device includes a substrate, a semiconductor layer disposed on the substrate, a drain electrode electrically connected to the semiconductor layer, a source electrode electrically connected to the semiconductor layer, and an insulator. The insulator is disposed between the source electrode and the drain electrode. The source electrode and the drain electrode are at least partially overlapped. The manufacturing method includes following steps. A substrate is provided; a semiconductor layer is formed on the substrate; a drain electrode is formed and electrically connected to the semiconductor layer; a source electrode is formed and electrically connected to the semiconductor layer; an insulator is formed between the source electrode and the drain electrode. The electronic device and its manufacturing method are able to improve resolution, reduce impedance, or enhance product performance.

19 Claims, 7 Drawing Sheets

ELECTRONIC DEVICE AND MANUFACTURING METHOD THEREOF

CROSS-REFERENCE TO RELATED APPLICATION

This application claims the priority benefit of China application serial no. 202111130397.2, filed on Sep. 26, 2021. The entirety of the above-mentioned patent application is hereby incorporated by reference herein and made a part of this specification.

BACKGROUND

Technical Field

The disclosure relates to an electronic device and a manufacturing method thereof; more particularly, the disclosure relates to an electronic device and a manufacturing method thereof capable of improving resolution, reducing impedance, or enhancing product performance.

Description of Related Art

Electronic devices such as mobile phones, televisions, surveillance devices, tablet computers, vehicle displays, wearable devices, and desktop computers all have the function of displaying images. With the vigorous development of the electronic devices, requirements for the quality of the electronic devices such as image resolution become higher and higher.

SUMMARY

The disclosure provides an electronic device and a manufacturing method thereof which are capable of improving resolution, reducing impedance, or improving product performance.

According to an embodiment of the disclosure, the electronic device includes a substrate, a semiconductor layer, a drain electrode, a source electrode, and an insulator. The semiconductor layer is disposed on the substrate. The drain electrode is electrically connected to the semiconductor layer. The source electrode is electrically connected to the semiconductor layer. The insulator is disposed between the source electrode and the drain electrode. The source electrode and the drain electrode are at least partially overlapped.

According to an embodiment of the disclosure, a manufacturing method of an electronic device includes following steps. A substrate is provided; a semiconductor layer is formed on the substrate; a drain electrode is formed and electrically connected to the semiconductor layer; a source electrode is formed and electrically connected to the semiconductor layer; an insulator is formed between the source electrode and the drain electrode. Here, the source electrode and the drain electrode are at least partially overlapped.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles provided in the disclosure.

DESCRIPTION OF THE EMBODIMENTS

Figure 1A:
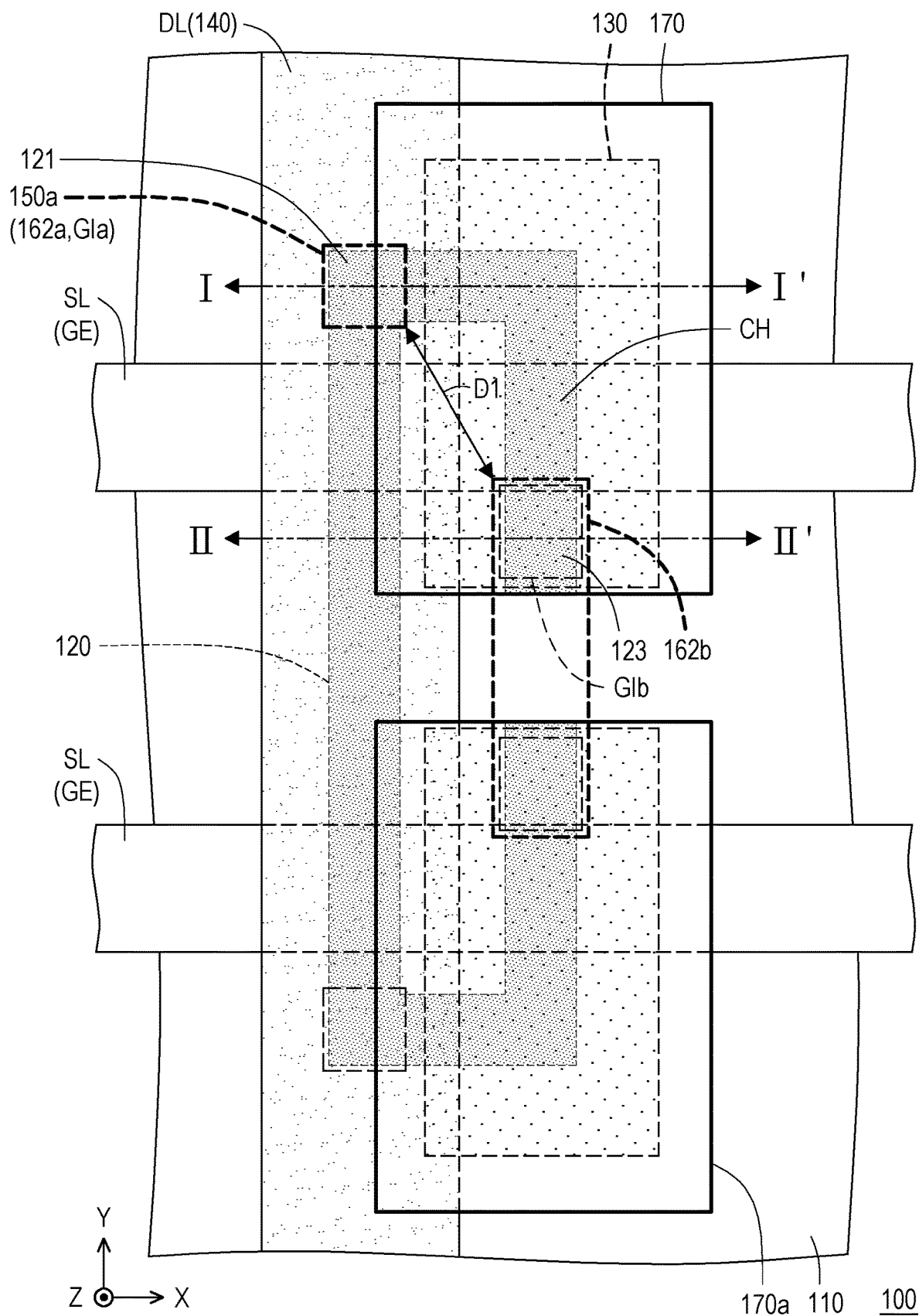
FIG. 1A is a schematic top view of a partial region of an electronic device according to an embodiment of the disclosure.

The disclosure may be understood by referring to the following detailed description with reference to the accompanying drawings. It is noted that for comprehension of the reader and simplicity of the drawings, in the drawings provided in the disclosure, only a part of the electronic apparatus is shown, and certain devices in the drawings are not necessarily drawn to actual scale. Moreover, the quantity and the size of each device in the drawings are only schematic and exemplary and are not intended to limit the scope of protection provided in the disclosure.

In the following specification and claims, the terminologies "having", "including", "comprising", and so on are open-ended terminologies, so they should be interpreted to mean "including but not limited to ...".

It should be understood that when a device or a film layer is described as being "on" or "connected to" another device or film layer, it may be directly on or connected to the another device or film layer, or there is an intervening device or film layer therebetween (i.e., indirect connection). Conversely, when an element or film layer is referred to as being "directly on" or "directly connected to" another element or film layer, no intervening elements or film layers are present in between. Moreover, such terms related to bonding and connection may also cover the case where two structures are both movable or where two structures are both fixed. In addition, the terminologies "coupling" or "electrical connection" described in this disclosure may refer to a direct connection or an indirect connection.

The terminologies such as "first", "second", "third", etc. may be used to describe elements, but the elements should not be limited by these terminologies. The terminologies are only intended to distinguish an element from another element in the specification. It is possible that the claims do not use the same terminologies and replace the terminologies with "first", "second", "third" etc. according to the sequence provided in the claims. Accordingly, in the specification, a first element may be a second element in the claims.

In some embodiments of the disclosure, an optical microscopy (OM), a scanning electron microscope (SEM), a thin film thickness profiler (α-step), an ellipsometer, or other suitable manner may be used to measure an area, a width, a thickness, or a height of each element or measure a distance or a spacing between elements. To be specific, according to some embodiments, a SEM may be used to obtain a cross-sectional structural image including elements to be measured, and measure an area, a width, a thickness, or a height of each element or measure a distance or a spacing between elements, which should however not be construed as a limitation in the disclosure. In addition, any two values or directions used for comparison may have certain errors.

Herein, the term "about", "approximately", "substantially", or "essentially" typically represents that a value is within 10% of a given value or range, or within 5%, 3%, 2%, 1%, or 0.5% of a given value or range. The given value here is an approximate value, namely implicitly meaning "about," "approximately", "substantially", or "essentially" without specifically indicating the terms "about," "approximately", "substantially", or "essentially".

In the disclosure, the electronic device may include but is not limited to a display device, a backlight device, an antenna device, a sensing device, or a splicing device. The electronic device may be a bendable or flexible electronic device. The electronic device may have a shape of a rectangle, a circle, or a polygon, a shape with curved edges, or any other suitable shape. An electronic element array in the display device may be a pixel array, where the pixels may include, for instance, a liquid crystal layer and a pixel electrode, a light emitting diode (LED), fluorescence, phosphor, quantum dot (QD), any other suitable material, or a combination thereof, which should however not be construed as a limitation in the disclosure. The LED may include an organic LED (OLED), a mini-LED, a micro-LED, or a quantum dot LED (QDLED or QLED), any other suitable material, or a combination thereof, which should however not be construed as a limitation in the disclosure. The display device may, for instance, include a splicing display device, which should however not be construed as a limitation in the disclosure. The antenna device may be a liquid crystal antenna, for instance, and its electronic elements may include an antenna unit, for instance, which should however not be construed as a limitation in the disclosure. The antenna device may, for instance, include but may be not limited to a splicing antenna device. Note that the electronic device may be but may not be limited to any arrangement or combination of the above. Besides, the electronic device may have a shape of a rectangle, a circle, or a polygon, a shape with curved edges, or any other suitable shape. The electronic device may have peripheral systems, such as a driving system, a control system, a light source system, a tier system, and the like to support the display device, the antenna device, or the splicing device. Hereinafter, a pixel array in the electronic device serves to describe the content of the disclosure, which should however not be construed as a limitation in the disclosure.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Reference will now be made in detail to the exemplary embodiments of the disclosure, and examples of the exemplary embodiments are illustrated in the accompanying drawings. Whenever possible, the same reference symbols are used in the drawings and descriptions to indicate the same or similar parts.

Figure 1B:
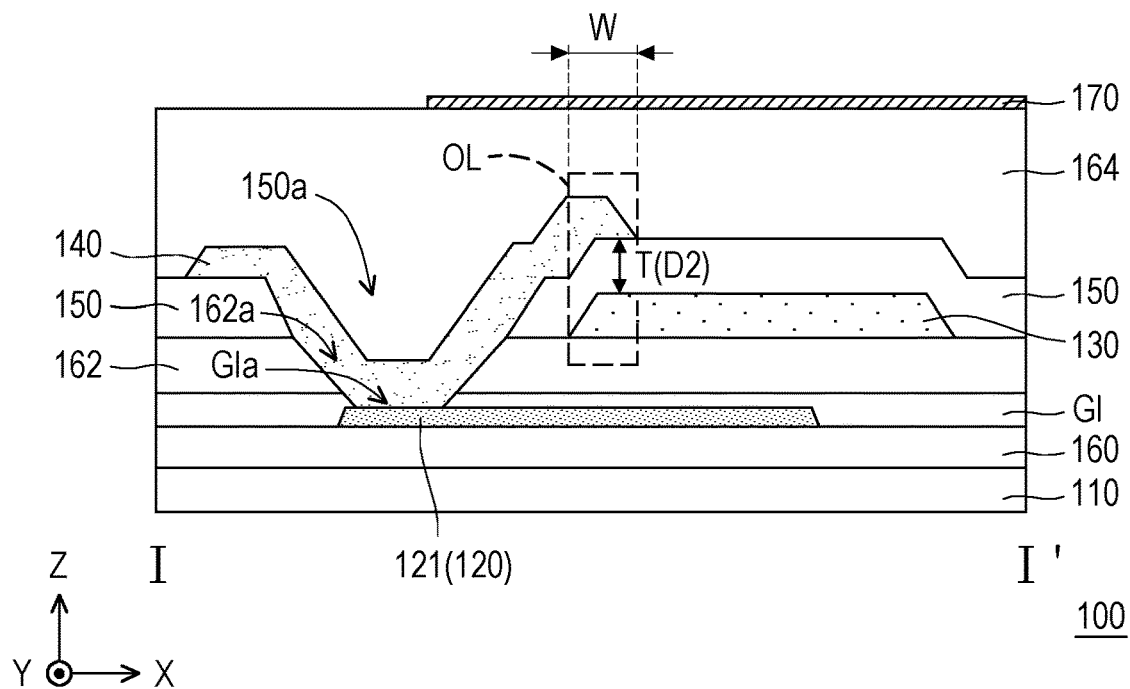
FIG. 1B is a schematic cross-sectional view of the electronic device depicted in FIG. 1A along a sectional line I-I'.
Figure 1C:
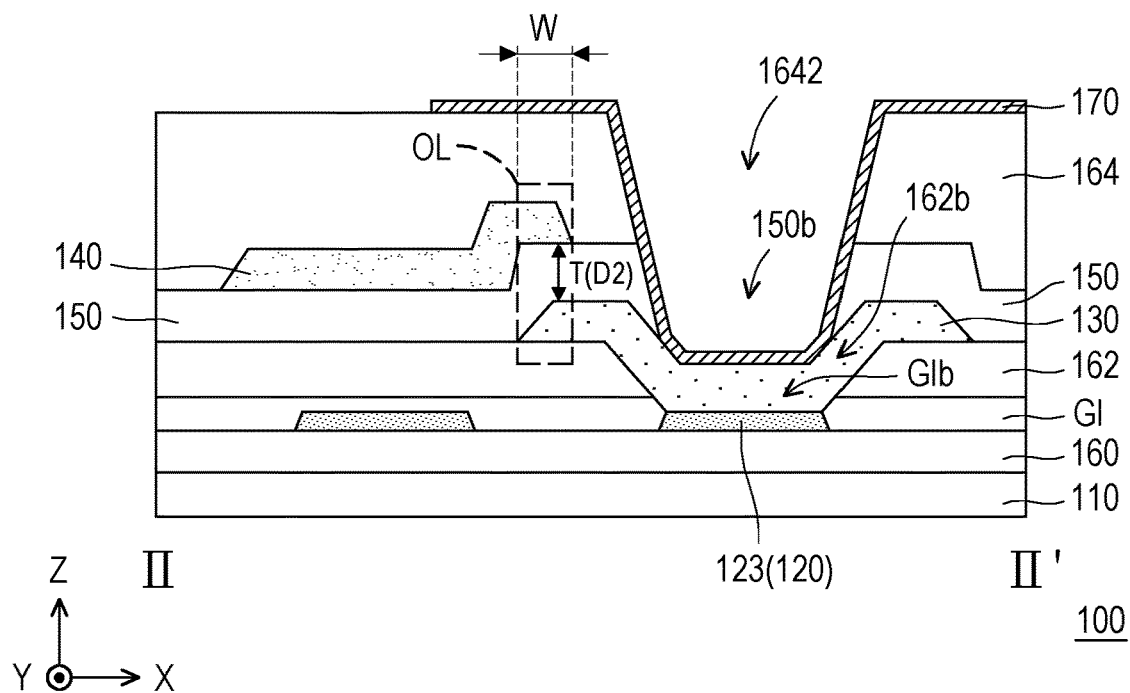
FIG. 1C is a schematic cross-sectional view of the electronic device depicted in FIG. 1A along a sectional line II-II'.

FIG. 1A is a schematic top view of a partial region of an electronic device according to an embodiment of the disclosure. FIG. 1B is a schematic cross-sectional view of the electronic device depicted in FIG. 1A along a sectional line I-I'. FIG. 1C is a schematic cross-sectional view of the electronic device depicted in FIG. 1A along a sectional line II-II'. For clarity of the accompanying drawings and illustrative purposes, some elements in the electronic device are omitted from FIG. 1A.

With reference to FIG. 1A, FIG. 1B, and FIG. 1C, an electronic device 100 provided in this embodiment may include a substrate 110, a semiconductor layer 120, a drain electrode 130, a source electrode 140, and an insulator 150. The semiconductor layer 120, the drain electrode 130, the source electrode 140, and the insulator 150 are all disposed on the substrate 110. Here, the substrate 110 may include a rigid substrate, a flexible substrate, or a combination thereof. For instance, a material of the substrate 110 may include glass, quartz, sapphire, ceramics, polycarbonate (PC), polyimide (PI), polyethylene terephthalate (PET), any other suitable substrate material, or a combination thereof, which should however not be construed as a limitation in the disclosure.

Specifically, in this embodiment, the electronic device 100 has a plurality of pixel units, and the electronic device 100 may further include a buffer layer 160, a gate insulator GI, a dielectric layer 162, an insulator 164, a gate electrode GE, pixel electrodes 170 and 170a, a scan line SL, and a data line DL. The buffer layer 160, the gate insulator GI, the dielectric layer 162, the insulator 164, the gate electrode GE, the pixel electrodes 170 and 170a, the scan line SL, and the data line DL are all disposed on the substrate 110. Here, the buffer layer 160, the gate insulator GI, the dielectric layer 162, and the insulator 164 may have a single-layer or multi-layer structure and may include an organic material, an inorganic material, or a combination thereof, which should however not be construed as a limitation in the disclosure.

In this embodiment, note that the scan line SL crosses over the data line DL, the drain electrode 130, and the source electrode 140, the gate electrode GE may be a part of the scan line SL, and the source electrode 140 may be a part of the data line DL copies, which should however not be construed as a limitation in the disclosure. For instance, in some embodiments, the gate electrode GE may have a branch-like structure extending from the scan line SL, and the source electrode 140 may also have a branch-like structure extending from the scan line SL. As shown in FIG. 1A and FIG. 1C, the pixel electrode 170 of one pixel unit located in the upper half of FIG. 1A may be electrically connected to the drain electrode 130 through an opening 1642 of the insulator 164 and a second via 150b of the insulator 150. Similarly, the pixel electrode 170a of the other pixel unit located in the lower half of FIG. 1A may further be electrically connected to the drain electrode 130 through the opening 164a of the insulator 164 and the second via 150b of the insulator 150. In addition, a dimension of the pixel electrode 170 and a dimension of the pixel electrode 170a shown in FIG. 1A are exemplary and should not be construed as limitations in the disclosure. In this embodiment, a direction X, a direction Y, and a direction Z are respectively different directions. The direction X is, for instance, an extension direction of the scan line SL, the direction Y is, for instance, an extension direction of the data line DL, and the direction Z is, for instance, a normal direction of the substrate 110. Here, the direction X is substantially perpendicular to the direction Y, and the direction X and the direction Y are substantially perpendicular to the direction Z, respectively, which should however not be construed as a limitation in the disclosure.

In this embodiment, the semiconductor layer 120 is disposed on the buffer layer 160. The semiconductor layer 120 includes a semiconductor source contact region 121, a channel region CH, and a drain contact region 123. The channel region CH is connected to the source contact region 121 and the drain contact region 123, and the channel region CH is located between the source contact region 121 and the drain contact region 123. In the schematic top view of the electronic device 100 (as shown in FIG. 1A), the profile of the semiconductor layer 120 may be shaped as a letter C, which should however not be construed as a limitation in the disclosure. A material of the semiconductor layer 120 may include amorphous silicon, low temperature polysilicon (LTPS), metal oxide ((e.g., indium gallium zinc oxide (IGZO)), any other suitable material, or a combination of the above, which should however not be construed as a limitation in the disclosure.

In this embodiment, the gate insulator GI is disposed on the semiconductor layer 120 to cover the semiconductor layer 120 and the buffer layer 160. The gate insulator GI may have an opening GIa and an opening GIb. The opening GIa may expose a portion of the source contact region 121 of the semiconductor layer 120, and the opening GIb may expose a portion of the drain contact region 123 of the semiconductor layer 120.

In this embodiment, the gate electrode GE is disposed between the substrate 110 and the semiconductor layer 120. The gate electrode GE may be disposed corresponding to the channel region CH in the semiconductor layer 120. That is, in the normal direction (i.e., the direction Z) of the substrate 110, the gate electrode GE may overlap the channel region CH of the semiconductor layer 120. The gate electrode GE may be electrically connected to the scan line SL.

In this embodiment, the dielectric layer 162 is disposed on the semiconductor layer 120 to cover the semiconductor layer 120 and the gate insulator GI. The dielectric layer 162 may have an opening 162a and an opening 162b. The opening 162a is connected to the opening GIa to expose the portion of the source contact region 121 of the semiconductor layer 120, and the opening 162b is connected to the opening GIb to expose the portion of the drain contact region 123 of the semiconductor layer 120. As shown in FIG. 1A, in the top view, note that the range of the opening 162b may partially overlap the pixel electrodes 170 and 170a at the same time, which should however not be construed as a limitation in the disclosure. In this embodiment, in the schematic top view of the electronic device 100 (as shown in FIG. 1A), there is a distance D1 between the opening 162a and the opening 162b, and the distance D1 is, for instance, about 3 micrometers (μm) to 15 μm (3 μm≤D1≤15 μm), which should however not be construed as a limitation in the disclosure. The distance D1 is, for instance, the minimum distance measured in the top view between a bottom of the opening 162a and a bottom of the opening 162b.

In this embodiment, the drain electrode 130 is disposed on the dielectric layer 162. The drain electrode 130 may further be partially disposed within the opening 162b of the dielectric layer 162 and the opening GIb of the gate insulator GI, so that the drain electrode 130 may be electrically connected to the drain contact region 123 of the semiconductor layer 120 through the opening 162b and the opening GIb. Here, a material of the drain electrode 130 may include a metal material, such as tungsten (W), molybdenum (Mo), molybdenum/aluminum/molybdenum alloy (Mo/Al/Mo alloy), titanium/aluminum/titanium alloy (Ti/Al/Ti alloy), any other suitable metal material, or alloys or combinations of the above materials, which should however not be construed as a limitation in the disclosure.

In this embodiment, the insulator 150 is disposed on the drain electrode 130 to cover the drain electrode 130 and the dielectric layer 162. The insulator 150 may be disposed between the source electrode 140 and the drain electrode 130. The insulator 150 may have a first via 150a and the second via 150b. The first via 150a communicates with the opening 162a and the opening GIa to expose the portion of the source contact region 121 of the semiconductor layer 120, and the second via 150b exposes a portion of the drain electrode 130.

In this embodiment, in the schematic cross-sectional view of the electronic device 100 (as shown in FIG. 1B and FIG. 1C), the insulator 150 has a thickness T. The thickness T of the insulator 150 is, for instance, within a range from 1100 angstroms (Å) to 4600 Å (1100 Å≤T≤4600 Å) to reduce risks of capacitance effects or short circuit between the source electrode 140 and the drain electrode 130, which should however not be construed as a limitation in the disclosure. Here, the thickness T of the insulator 150 may be, for instance, the minimum thickness measured along the normal direction (i.e., the direction Z) of the substrate 110. In this embodiment, the insulator 150 may have a single-layer or multi-layer structure, and the insulator 150 may be an inorganic insulator, which should however not be construed as a limitation in the disclosure. In some embodiments, the insulator may further be an organic insulator or may have a multi-layer structure formed by overlapping the inorganic insulator and the organic insulator.

In this embodiment, the source electrode 140 is disposed on the insulator 150, so that the source electrode 140 and the drain electrode 130 may be disposed at different film layers, respectively. The source electrode 140 may further be partially disposed in the first via 150a of the insulator 150, the opening 162a of the dielectric layer 162, and the opening GIa of the gate insulator GI, so that the source electrode 140 may be electrically connected to the source electrode contact region 121 of the semiconductor layer 120 through the first via 150a, the opening 162a, and the opening GIa. The source electrode 140 may be electrically connected to the data line DL, and the source electrode 140 may be a part of the data line DL. Here, a material of the source electrode 140 may include a metal material, such as W, MO, Mo/Al/Mo alloy, Ti/Al/Ti alloy, any other suitable metal material, or alloys or combinations of the above materials, which should however not be construed as a limitation in the disclosure.

In this embodiment, in the cross-sectional schematic diagram of the electronic device 100 (as shown in FIG. 1B and FIG. 1C), the source electrode 140 and the drain electrode 130 may be at least partially overlapped in the normal direction (i.e., the direction Z) of the substrate 110, so as to define an overlapping region OL of the source electrode 140 and the drain electrode 130. That is, in a top view, a positive projection of the source electrode 140 on the substrate 110 may be at least partially overlapped with a positive projection of the drain electrode 130 on the substrate 110. In addition, according to this embodiment, in the overlapping region OL of the source electrode 140 and the drain electrode 130, there is a distance D2 between the source electrode 140 and the drain electrode 130 in the normal direction (i.e., the direction Z) of the substrate 110. Here, the distance D2 is, for instance, the minimum distance measured between the source electrode 140 and the drain electrode 130 along the normal direction (i.e., the direction Z) of the substrate 110 (e.g., the distance between a lower surface of the source electrode 140 adjoining the insulator 150 and an upper surface of the drain electrode 130 adjoining the insulator 150). In this embodiment, the distance D2 may be substantially equal to the thickness T of the insulator 150. That is, in the overlapping region OL of the source electrode 140 and the drain electrode 130, the distance D2 between the source electrode 140 and the drain electrode 130 is, for instance, within a range from 1100 Å to 4600 Å (1100 Å≤T≤4600 Å). However, in other embodiments, the thickness T of the insulator 150 and the distance D2 may be different. In some embodiments, note that the positive projection of the source electrode 140 and the positive projection of the drain electrode 130 may not be overlapped or may be aligned at the edges, so as to reduce the capacitance between the two electrodes.

In this embodiment, the drain electrode 130 and the source electrode 140 may be respectively disposed in different film layers, and the source electrode 140 and the drain electrode 130 may be at least partially overlapped in the normal direction (i.e., the direction Z) of the substrate 110 (i.e., the overlapping region OL); therefore, the overall width of the pixel units measured in the top view may be reduced, which reduces the densities of the pixel units in the electronic device 100 and thereby increases the resolution; alternatively, a line width of the drain electrode 130 and a line width of the source electrode 140 may be increased, which further reduces impedance or improves product performance. Here, the line width of the drain electrode 130 (or the line width of the source electrode 140) is, for instance, the maximum width of the drain electrode 130 (or the source electrode 140) measured along the direction X in the top view. A width of the overlapping portion between the drain electrode 130 and the source electrode 140 (i.e., the width W of the overlapping region OL) may be defined as a distance from an edge of the drain electrode 130 to an edge of the source electrode 140, which is measured in the extension direction (i.e., the direction X) of the scan line SL in the region where the drain electrode 130 and the source electrode 140 are overlapped in the cross-sectional view. In some embodiments, the width W of the overlapping portion may range from 0.5 μm to 2 μm (0.5 μm≤W≤2 μm).

In this embodiment, the insulator 164 is disposed on the source electrode 140 to cover the source electrode 140 and the insulator 150. The insulator 164 may have the opening 1642 to communicate with the second via 150b and expose a portion of the drain electrode 130.

In this embodiment, the pixel electrode 170 is disposed on the insulator 164. The pixel electrode 170 may further be partially disposed within the opening 1642 of the insulator 164 and the second via 150b of the insulator 150, so that the pixel electrode 170 may be electrically connected to the drain electrode 130 through the opening 1642 and the second via 150b. Here, a material of the pixel electrode 170 may be different from the material of the source electrode 140 and the drain electrode 130 and may include, for instance, a transparent conductive material, which should however not be construed as a limitation in the disclosure.

In this embodiment, a manufacturing method of the electronic device 100 may, for instance, include but may not be limited to following steps. A substrate 110 is provided. After a buffer layer 160 is formed on the substrate 110, a semiconductor layer 120 is formed on the substrate 110 and the buffer layer 160. A gate insulator GI and a dielectric layer 162 are formed above the semiconductor layer 120, and openings GIa and GIb of the gate insulator GI and openings 162a and 162b of the dielectric layer 162 are formed. A drain electrode 130 is formed, so that the drain electrode 130 may be electrically connected to the semiconductor layer 120 through the opening 162b of the dielectric layer 162 and the opening GIb of the gate insulator GI. An insulator 150 is formed above the drain electrode 130, and a first via 150a and a second via 150b of the insulator 150 are formed. After the insulator 150 is formed, a source electrode 140 is formed above the insulator 150, so that the source electrode 140 may be electrically connected to the semiconductor layer 120 through the first via 150a of the insulator 150, the opening 162a of the dielectric layer 162, and the opening GIa of the gate insulator GI. Here, the insulator 150 may be formed between the source electrode 140 and the drain electrode 130, and the source electrode 140 and the drain electrode 130 may be at least partially overlapped. After that, an insulator 164 is formed above the source electrode 140, and an opening 1642 is formed. Finally, a pixel electrode 170 is formed above the insulator 164, so that the pixel electrode 170 may be electrically connected to the drain electrode 130 through the opening 1642 of the insulator 164 and the first via 150a of the insulator 150. So far, the fabrication of the electronic device 100 provided in this embodiment is completed.

As mentioned above, in the manufacturing method of the electronic device 100 according to this embodiment, the drain electrode 130 and the source electrode 140 are formed in different manufacturing steps. Therefore, the drain electrode 130 and the source electrode 140 may be respectively disposed at different film layers, and the source electrode 140 and the drain electrode 130 may be at least partially overlapped in the normal direction (i.e., the direction Z) of the substrate 110 (i.e., the overlapping region OL). Accordingly, the overall width of the pixel units measured in the top view may be reduced, which reduces the densities of the pixel units in the electronic device 100 and thereby increases the resolution; alternatively, the line width of the drain electrode 130 and the line width of the source electrode 140 may be increased, which further reduces impedance or improves product performance.

In the manufacturing method of the electronic device 100 according to this embodiment, although the drain electrode 130 is formed before the source electrode 140 is formed (i.e., the drain electrode 130 and the source electrode 140 are formed in different steps), the order in which the drain electrode 130 and the source electrode 140 are formed is not limited in the disclosure, given that the drain electrode 130 and the source electrode 140 may be respectively disposed at different film layers, and that the drain electrode 130 and the source electrode 140 may be at least partially overlapped in the normal direction (i.e., the direction Z) of the substrate 110. That is, in some embodiments, the source electrode may be formed before the drain electrode is formed according to product and design requirements, as shown in FIG. 1D to FIG. 1E.

Other embodiments are provided below for explanations. Note that the reference numbers and some content provided in the previous embodiments are also applied in the following embodiments, the same reference numbers represent the same or similar elements, and descriptions of the same technical content are omitted. The descriptions of the omitted content may be found in the previous embodiments and will not be repeated in the following embodiments.

Figure 1D:
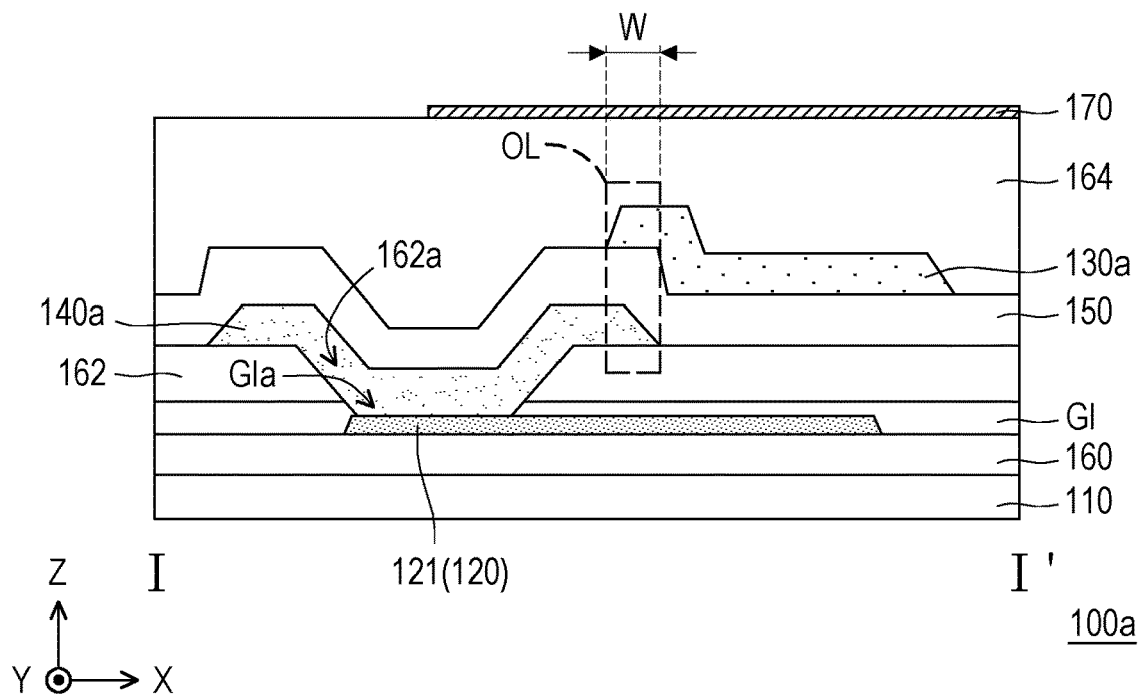
FIG. 1D is a schematic cross-sectional view of the electronic device depicted in FIG. 1A along the sectional line I-I' according to another embodiment of the disclosure.

FIG. 1D is a schematic cross-sectional view of the electronic device depicted in FIG. 1A along the sectional line I-I' according to another embodiment of the disclosure. FIG. 1E is a schematic cross-sectional view of the electronic device depicted in FIG. 1A along the sectional line II-IF according to another embodiment of the disclosure. With reference to FIG. 1B to FIG. 1C and FIG. 1D to FIG. 1E, an electronic device 100a provided in this embodiment is substantially similar to the electronic device 100 depicted in FIG. 1B to FIG. 1C, so the same and similar components in the two embodiments will not be repeated hereinafter. The difference between the electronic device 100a provided in the embodiment and the electronic device 100 lies in that a source electrode 140a in the electronic device 100a provided in this embodiment is formed before a drain electrode 130a is formed, so that the source electrode 140a and the drain electrode 130a may be respectively disposed at different film layers.

Figure 1E:
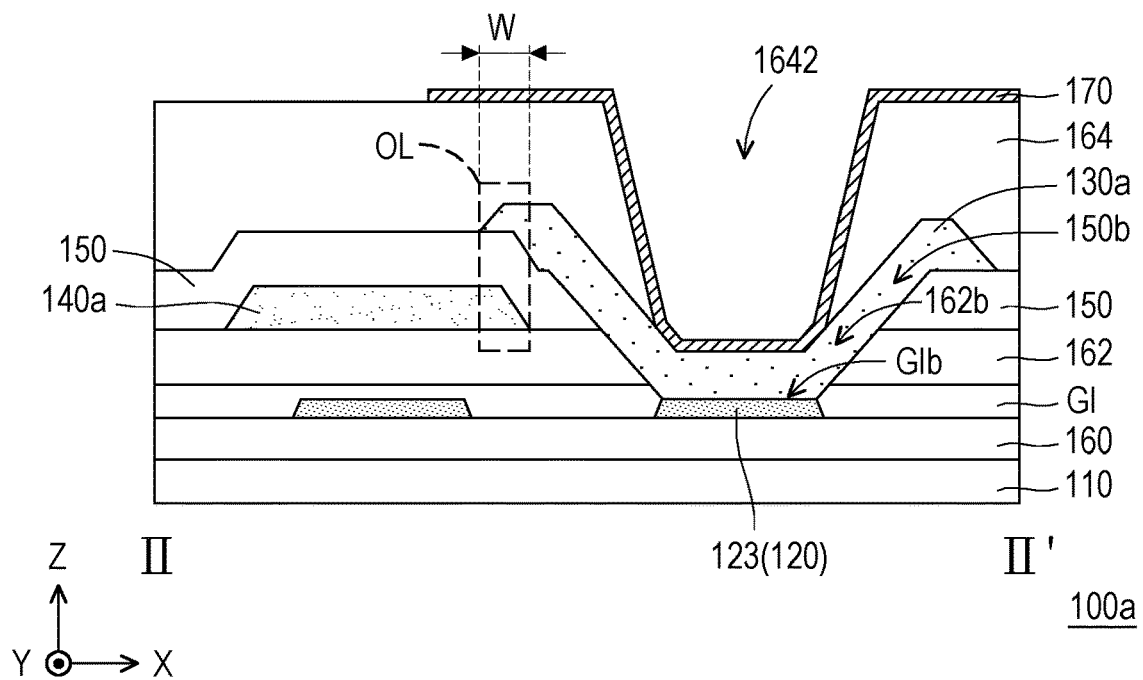
FIG. 1E is a schematic cross-sectional view of the electronic device depicted in FIG. 1A along the sectional line II-II' according to another embodiment of the disclosure.

Specifically, with reference to FIG. 1D and FIG. 1E, in this embodiment, the source electrode 140a is disposed on the dielectric layer 162, and the source electrode 140a may further be partially disposed within the opening 162a of the dielectric layer 162 and the opening GIa of the gate insulator GI, so that the source electrode 140a may be electrically connected to the source contact region 121 of the semiconductor layer 120 through the opening 162a and the opening GIa.

The insulator 150 is disposed on the source electrode 140a to cover the source electrode 140a and the dielectric layer 162. The second via 150b of the insulator 150 communicates with the opening 162b and the opening GIb to expose a portion of the drain contact region 123 of the semiconductor layer 120.

The drain electrode 130a is disposed on the insulator 150, and the drain electrode 130a may further be partially disposed in the second via 150b of the insulator 150, the opening 162b of the dielectric layer 162, and the opening GIb of the gate insulator GI, so that the drain electrode 130a may be electrically connected to the drain contact region 123 of the semiconductor layer 120 through the second via 150b, the opening 162b, and the opening GIb.

The insulator 164 is disposed on the drain electrode 130a to cover the drain electrode 130a and the insulator 150. The opening 1642 of the insulator 164 may expose a portion of the drain electrode 130a.

The pixel electrode 170 is disposed on the insulator 164. The pixel electrode 170 may further be partially disposed within the opening 1642 of the insulator 164, so that the pixel electrode 170 may be electrically connected to the drain electrode 130a through the opening 1642.

In this embodiment, the drain electrode 130a and the source electrode 140a may be respectively disposed at different film layers, and the source electrode 140a and the drain electrode 130a may be at least partially overlapped in the normal direction (i.e., the direction Z) of the substrate 110 (i.e., the overlapping region OL; therefore, the overall width of the pixel units measured in the top view may be reduced, which reduces the densities of the pixel units in the electronic device 100a and thereby increases the resolution; alternatively, the line width of the drain electrode 130a and the line width of the source electrode 140a may be increased, which further reduces impedance or improves product performance.

Figure 2A:
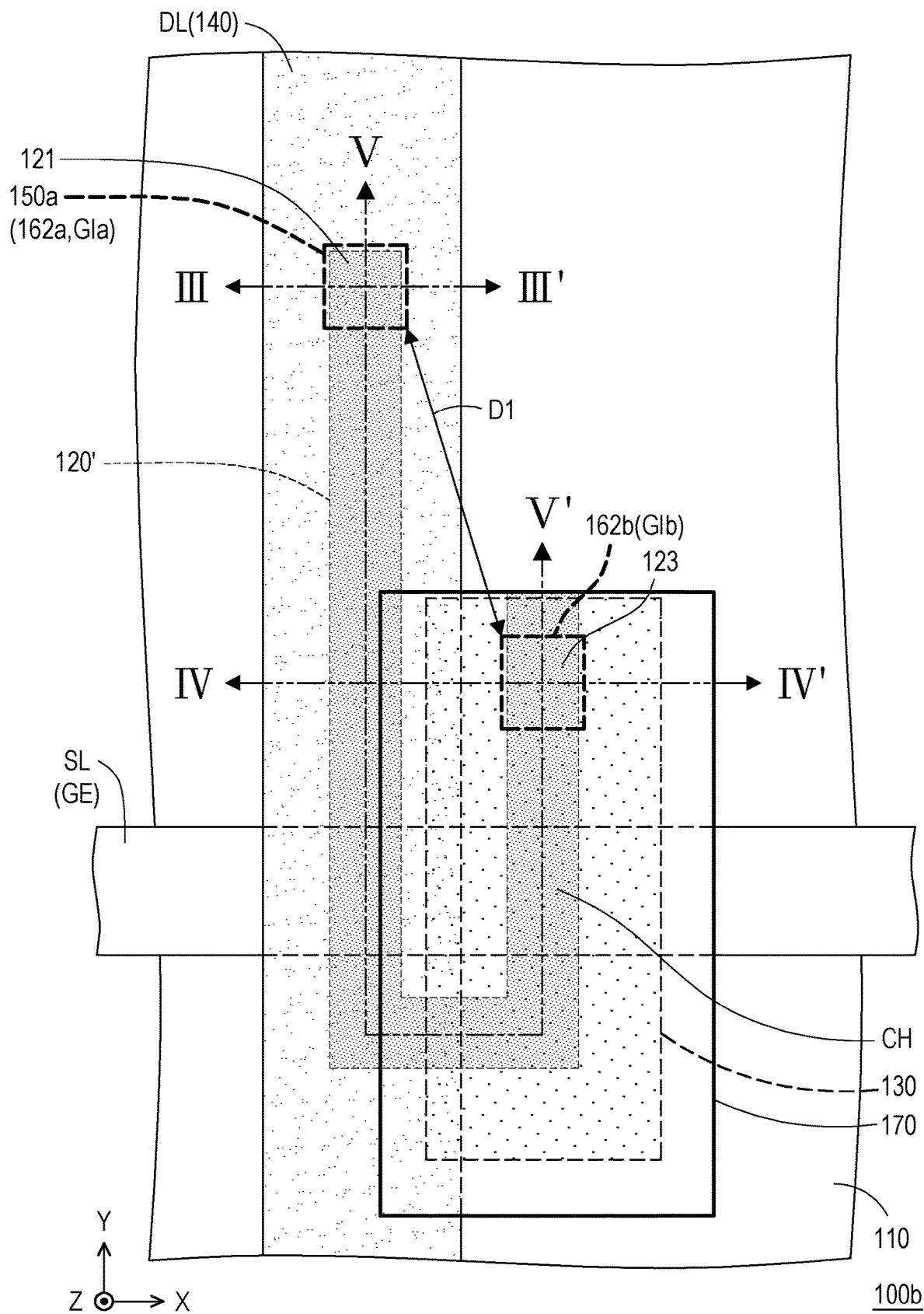
FIG. 2A is a schematic top view of a partial region of an electronic device according to another embodiment of the disclosure.
Figure 2B:
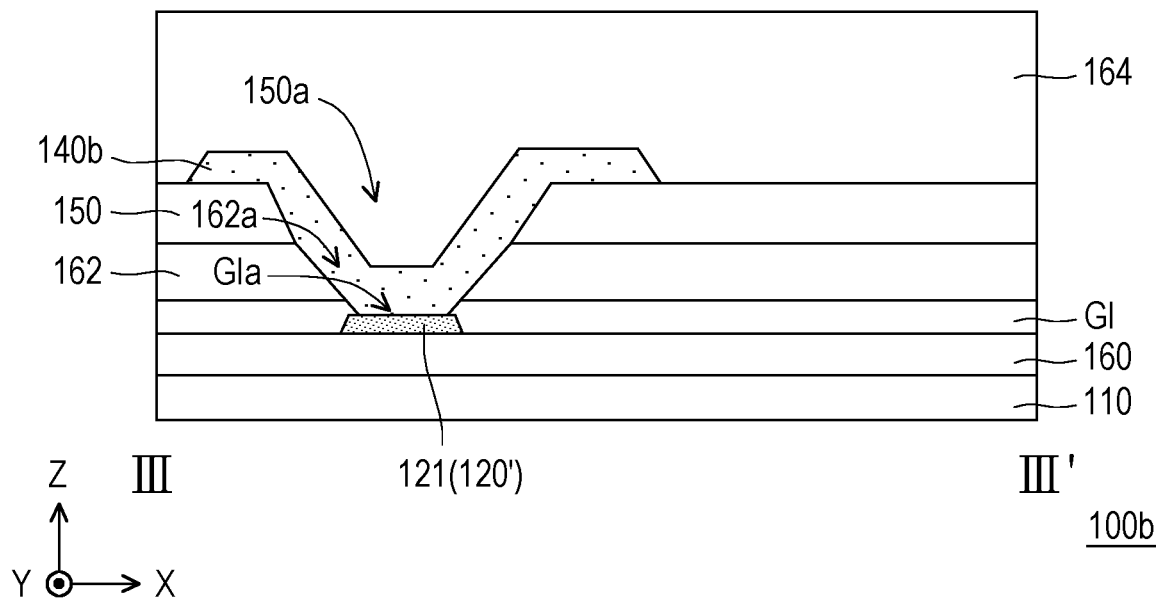
FIG. 2B is a schematic cross-sectional view of the electronic device depicted in FIG. 2A along a sectional line III-III'.
Figure 2C:
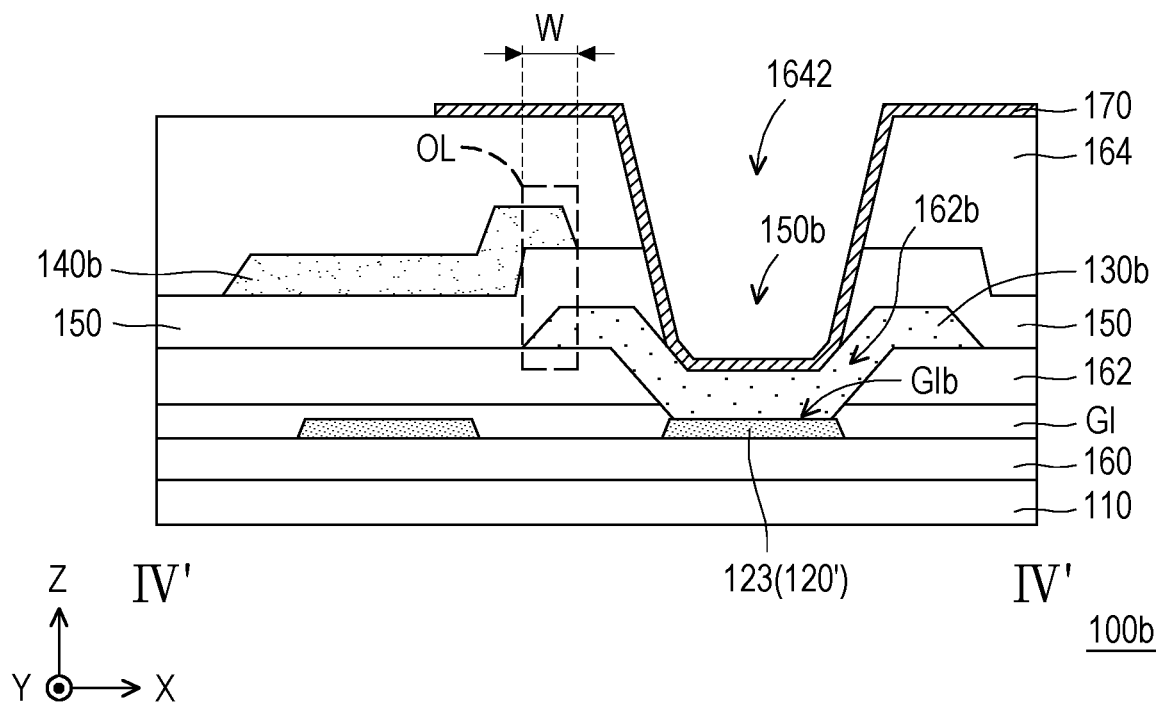
FIG. 2C is a schematic cross-sectional view of the electronic device depicted in FIG. 2A along a sectional line IV-IV'.
Figure 2D:
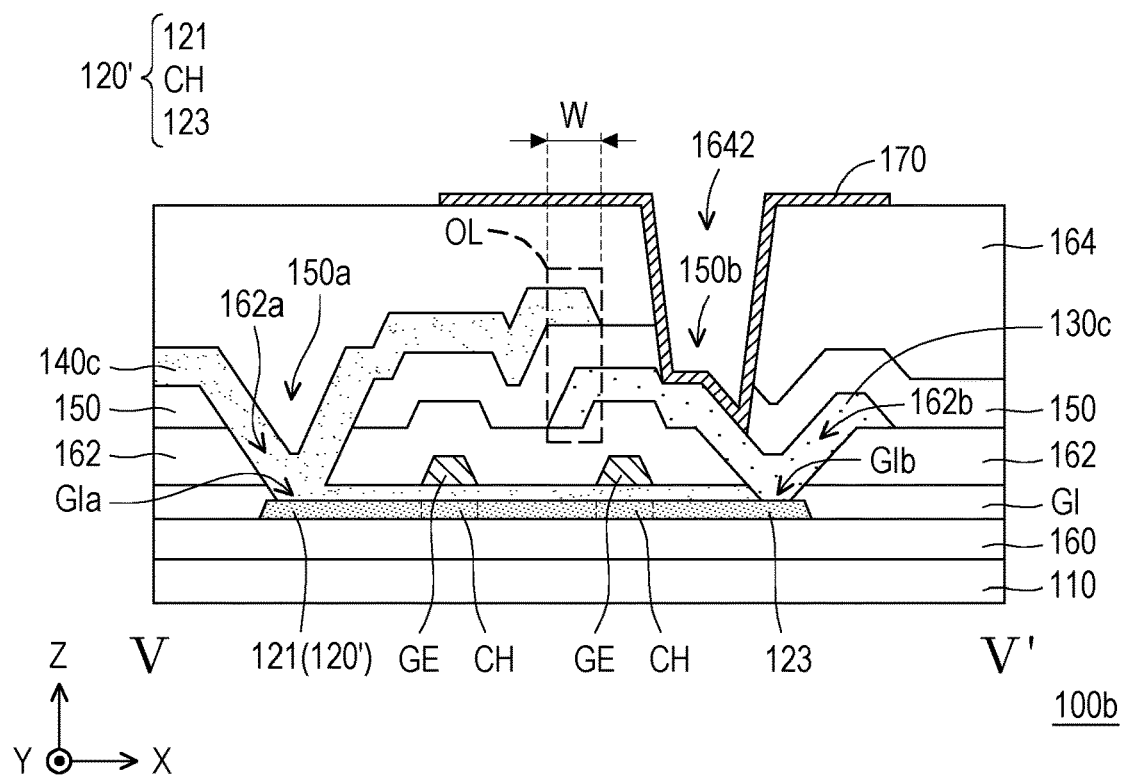
FIG. 2D is a schematic cross-sectional view of the electronic device depicted in FIG. 2A along a sectional line V-V'.

FIG. 2A is a schematic top view of a partial region of an electronic device according to another embodiment of the disclosure. FIG. 2B is a schematic cross-sectional view of the electronic device depicted in FIG. 2A along a sectional line FIG. 2C is a schematic cross-sectional view of the electronic device depicted in FIG. 2A along a sectional line IV-IV'. FIG. 2D is a schematic cross-sectional view of the electronic device depicted in FIG. 2A along a sectional line V-V'. With reference to FIG. 1A to FIG. 1C and FIG. 2A to FIG. 2D, an electronic device 100b provided in this embodiment is substantially similar to the electronic device 100 depicted in FIG. 1A to FIG. 1C, so the same and similar components in the two embodiments will not be repeated hereinafter. The difference between the electronic device 100b provided in the embodiment and the electronic device 100 lies in that the profile of a semiconductor layer 120 may be shaped as a letter U in the schematic top view of the electronic device 100b according to the embodiment (as shown in FIG. 2A).

Specifically, with reference to FIG. 2A to FIG. 2D, in this embodiment, a drain electrode 130b is disposed on the dielectric layer 162, and the drain electrode 130b may further be partially disposed within the opening 162b of the dielectric layer 162 and the opening GIb of the gate insulator GI, so that the drain electrode 130b may be electrically connected to the drain contact region 123 of the semiconductor layer 120' through the opening 162b and the opening GIb.

The insulator 150 is disposed on the drain electrode 130b to cover the drain electrode 130b and the dielectric layer 162. The first via 150a of the insulator 150 communicates with the opening 162a and the opening GIa to expose a portion of the source contact region 121 of the semiconductor layer 120'.

A source electrode 140b is disposed on the insulator 150, and the source electrode 140b may further be partially disposed in the first via 150a of the insulator 150, the opening 162a of the dielectric layer 162, and the opening GIa of the gate insulator GI, so that the source electrode 140b may be electrically connected to the source contact region 121 of the semiconductor layer 120' through the first via 150a, the opening 162a, and the opening GIa.

The insulator 164 is disposed on the source electrode 140b to cover the source electrode 140b and the insulator 150. The opening 1642 of the insulator 164 is connected to the second via 150b of the insulator 150 to expose a portion of the drain electrode 130b.

The pixel electrode 170 is disposed on the insulator 164. The pixel electrode 170 may further be partially disposed within the opening 1642 of the insulator 164 and the second via 150b of the insulator 150, so that the pixel electrode 170 may be electrically connected to the drain electrode 130b through the opening 1642 and the second via 150b.

In this embodiment, the drain electrode 130b and the source electrode 140b may be respectively disposed at different film layers, and the source electrode 140b and the drain electrode 130b may be partially overlapped in the normal direction (i.e., the direction Z) of the substrate 110 (i.e., the overlapping region OL). Here, a width of an overlapping portion between the drain electrode 130n and the source electrode 140n (i.e., the width W of the overlapping region OL) may be defined as a distance from an edge of the drain electrode 130b to an edge of the source electrode 140b, which is measured in the extension direction (i.e., the direction X) of the scan line SL in the region where the drain electrode 130b and the source electrode 140b are overlapped in the cross-sectional view. the width of the overlapping portion of the drain electrode 130 and the source electrode 140 (that is, the width W of the overlapping region OL) can be defined as the distance from the edge of the drain electrode 130 to the edge of the source electrode 140 measured in the extension direction (i.e., direction X) of the scan line SL in the region where the drain electrode 130 and the source electrode 140 overlap in the cross-sectional view. In some embodiments, the width W of the overlapping portion may range from 0.5 µm to 2 µm (0.5 µm≤W≤2 µm).

Since the drain electrode 130b and the source electrode 140b are partially overlapped, the overall width of the pixel units measured in the top view may be reduced, which reduces the densities of the pixel units in the electronic device 100b and thereby increases the resolution; alternatively, the line width of the drain electrode 130b and the line width of the source electrode 140b may be increased, which further reduces impedance or improves product performance.

In a manufacturing method of the electronic device 100b according to this embodiment, although the drain electrode 130b is formed before the source electrode 140b is formed, the order in which the drain electrode 130b and the source electrode 140b are formed is not limited in the disclosure, given that the drain electrode 130b and the source electrode 140b may be respectively disposed at different film layers, and that the drain electrode 130b and the source electrode 140b may be at least partially overlapped in the normal direction (i.e., the direction Z) of the substrate 110. That is, in some embodiments, the source electrode may be formed before the drain electrode is formed according to product and design requirements, as shown in FIG. 2E to FIG. 2G.

Figure 2E:
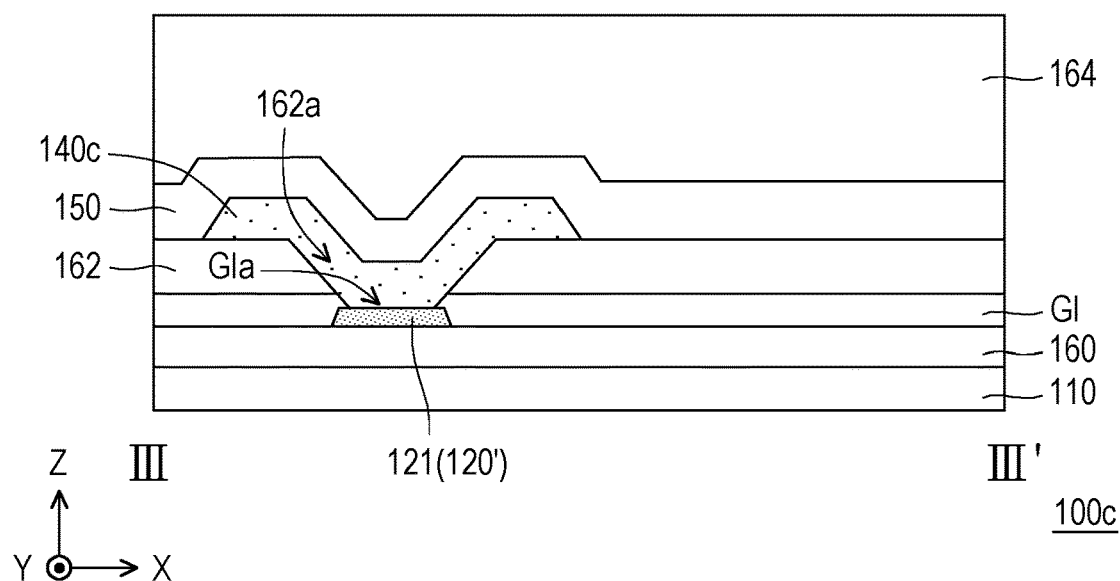
FIG. 2E is a schematic cross-sectional view of the electronic device depicted in FIG. 2A along the sectional line III-III' according to another embodiment of the disclosure.

FIG. 2E is a schematic cross-sectional view of the electronic device depicted in FIG. 2A along the sectional line according to another embodiment of the disclosure. FIG. 2F is a schematic cross-sectional view of the electronic device depicted in FIG. 2A along the sectional line IV-IV' according to another embodiment of the disclosure. FIG. 2G is a schematic cross-sectional view of the electronic device depicted in FIG. 2A along the sectional line V-V' according to another embodiment of the disclosure. With reference to FIG. 2B to FIG. 2D and FIG. 2E to FIG. 2G, an electronic device 100c provided in this embodiment is substantially similar to the electronic device 100b depicted in FIG. 2B to FIG. 2D, so the same and similar components in the two embodiments will not be repeated hereinafter. The difference between the electronic device 100c provided in the embodiment and the electronic device 100b lies in that a source electrode 140c is formed before a drain electrode 130c is formed in the electronic device 100c provided in this embodiment, so that the source electrode 140c and the drain electrode 130c may be respectively disposed at different film layers.

Figure 2F:
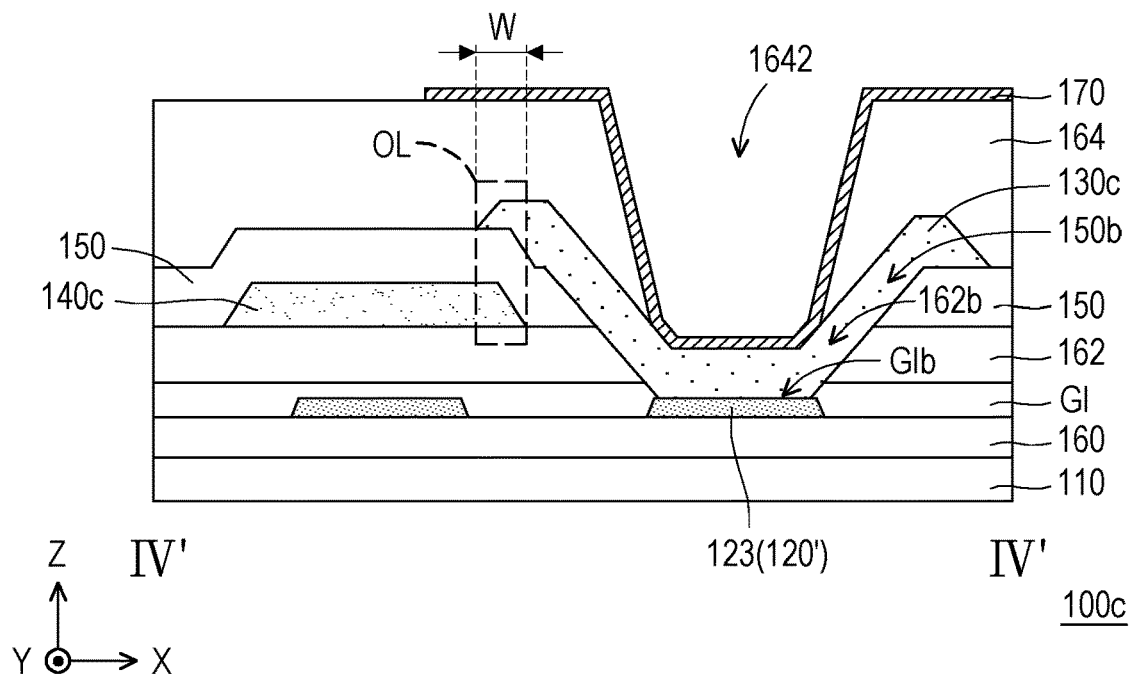
FIG. 2F is a schematic cross-sectional view of the electronic device depicted in FIG. 2A along the sectional line IV-IV' according to another embodiment of the disclosure.
Figure 2G:
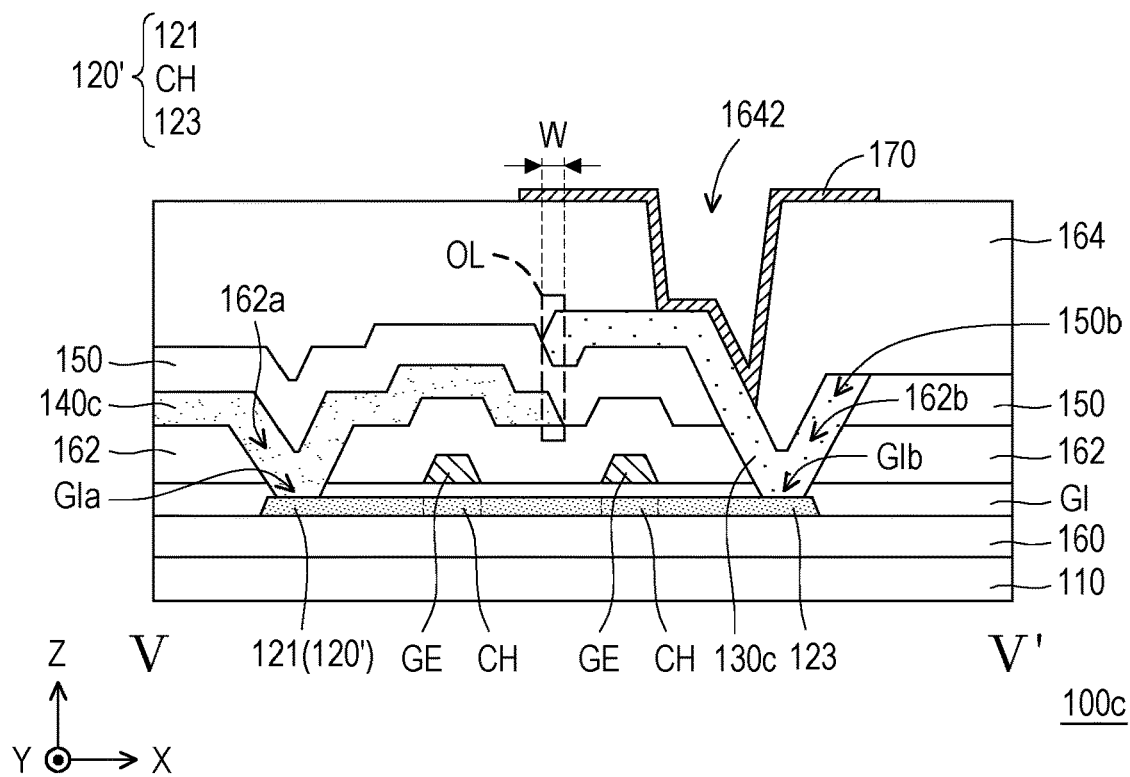
FIG. 2G is a schematic cross-sectional view of the electronic device depicted in FIG. 2A along the sectional line V-V' according to another embodiment of the disclosure.

Specifically, with reference to FIG. 2E to FIG. 2G, in this embodiment, the source electrode 140c is disposed on the dielectric layer 162, and the source electrode 140c may further be partially disposed within the opening 162a of the dielectric layer 162 and the opening GIa of the gate insulator GI, so that the source electrode 140c may be electrically connected to the source contact region 121 of the semiconductor layer 120' through the opening 162a and the opening GIa.

The insulator 150 is disposed on the source electrode 140c to cover the source electrode 140c and the dielectric layer 162. The second via 150b of the insulator 150 communicates with the opening 162b and the opening GIb to expose a portion of the drain contact region 123 of the semiconductor layer 120'.

The drain electrode 130c is disposed on the insulator 150, and the drain electrode 130c may further be partially disposed in the second via 150b of the insulator 150, the opening 162b of the dielectric layer 162, and the opening GIb of the gate insulator GI, so that the drain electrode 130c may be electrically connected to the drain contact region 123 of the semiconductor layer 120' through the second via 150b, the opening 162b, and the opening GIb.

The insulator 164 is disposed on the drain electrode 130c to cover the drain electrode 130c and the insulator 150. The opening 1642 of the insulator 164 may expose a portion of the drain electrode 130c.

The pixel electrode 170 is disposed on the insulator 164. The pixel electrode 170 may further be disposed within the opening 1642 of the insulator 164, so that the pixel electrode 170 may be electrically connected to the drain electrode 130c through the opening 1642.

In this embodiment, the drain electrode 130c and the source electrode 140c may be respectively disposed at different film layers, and the source electrode 140c and the drain electrode 130c may be at least partially overlapped in the normal direction (i.e., the direction Z) of the substrate 110 (i.e., the overlapping region OL). As mentioned above, since the drain electrode 130 and the source electrode 140 are partially overlapped, the overall width of the pixel units measured in the top view may be reduced, which reduces the densities of the pixel units in the electronic device 100c and thereby increases the resolution; alternatively, the line width of the drain electrode 130c and the line width of the source electrode 140c may be increased, which further reduces impedance or improves product performance.

To sum up, in the electronic device and the manufacturing method thereof according to one or more embodiments of the disclosure, the drain electrode and the source electrode are formed in different steps; hence, the drain electrode and the source electrode may be disposed at different layers, and the source electrode and the drain electrode may be at least partially overlapped in the normal direction (i.e., the direction Z) of the substrate (i.e., the overlapping region). Thereby, the line width (or area) of the drain electrode and the line width (or area) of the source electrode may be increased, and the line spacing between the drain electrode and the source electrode may be increased, so that the manufacturing method of the electronic device provided in one or more embodiments of the disclosure may lead to the reduction of impedance or the improvement of product performance.

Finally, it should be noted that the above embodiments merely serve to illustrate the technical schemes of the disclosure rather than limiting the disclosure. Although the disclosure has been described in detail with reference to the foregoing embodiments, those of ordinary skill in the pertinent art should understand that it is possible to modify the technical schemes described in the foregoing embodiments or equivalently replace some or all of the technical features; and these modifications or replacements do not make the nature of the corresponding technical schemes deviate from the technical schemes of the embodiments provided in the disclosure.

What is claimed is:

1. An electronic device, comprising:
   a substrate;
   a semiconductor layer, disposed on the substrate;
   a drain electrode, electrically connected to the semiconductor layer;
   a source electrode, electrically connected to the semiconductor layer;
   an insulator, disposed between the source electrode and the drain electrode; and
   a dielectric layer, disposed on the semiconductor layer and having a first opening and a second opening,
   wherein the source electrode and the drain electrode are at least partially overlapped,
   wherein the source electrode is electrically connected to the semiconductor layer through the first opening, and the drain electrode is electrically connected to the semiconductor layer through the second opening.

2. The electronic device according to claim 1, wherein the insulator is disposed on the drain electrode, the source electrode is disposed on the insulator, the insulator further comprises a first via, and the source electrode is electrically connected to the semiconductor layer through the first via.

3. The electronic device according to claim 1, wherein the insulator is disposed on the source electrode, the drain electrode is disposed on the insulator, the insulator comprises a second via, and the drain electrode is electrically connected to the semiconductor layer through the second via.

4. The electronic device according to claim 1, further comprising:
   a pixel electrode, electrically connected to the drain electrode.

5. The electronic device according to claim 4, wherein the insulator is disposed on the drain electrode, the source electrode is disposed on the insulator, the insulator comprises a second via, and the pixel electrode is electrically connected to the semiconductor layer through the second via.

6. The electronic device according to claim 4, wherein the insulator is disposed on the source electrode, the drain electrode is disposed on the insulator, the insulator comprises a first via, and the pixel electrode is electrically connected to the semiconductor layer through the first via.

7. The electronic device according to claim 1, wherein the drain electrode and the source electrode comprise a metal material.

8. The electronic device according to claim 1, wherein a thickness of the insulator ranges from 1100 angstroms to 4600 angstroms.

9. The electronic device according to claim 8, wherein the insulator is an inorganic insulator.

10. The electronic device according to claim 1, wherein a distance between the first opening and the second opening ranges from 3 micrometers to 15 micrometers.

11. The electronic device according to claim 1, wherein a distance between the source electrode and the drain electrode in a normal direction of the substrate is substantially equal to a thickness of the insulator.

12. The electronic device according to claim 11, wherein the distance ranges from 1100 angstroms to 4600 angstroms.

13. The electronic device according to claim 1, further comprising:
   an overlapping region, defined as an overlapping portion where the source electrode and the drain electrode are at least partially overlapped in a normal direction of the substrate.

14. The electronic device according to claim 13, wherein a width of the overlapping region ranges from 0.5 micrometer to 2 micrometers.

15. A manufacturing method of an electronic device, comprising:
   providing a substrate;
   forming a semiconductor layer on the substrate;
   forming a dielectric layer on the semiconductor layer, wherein the dielectric layer has a first opening and a second opening;
   forming a drain electrode electrically connected to the semiconductor layer;
   forming a source electrode electrically connected to the semiconductor layer; and
   forming an insulator between the source electrode and the drain electrode,
   wherein the source electrode and the drain electrode are at least partially overlapped,
   wherein the source electrode is electrically connected to the semiconductor layer through the first opening, and the drain electrode is electrically connected to the semiconductor layer through the second opening.

16. The manufacturing method according to claim 15, wherein the insulator is disposed on the drain electrode, the source electrode is disposed on the insulator, the insulator comprises a first via, and the source electrode is electrically connected to the semiconductor layer through the first via.

17. The manufacturing method according to claim 15, wherein the insulator is disposed on the source electrode, the drain electrode is disposed on the insulator, the insulator comprises a second via, and the drain electrode is electrically connected to the semiconductor layer through the second via.

18. The manufacturing method according to claim 15, wherein a distance between the source electrode and the drain electrode in a normal direction of the substrate is substantially equal to a thickness of the insulator.

19. The manufacturing method according to claim 18, wherein the distance ranges from 1100 angstroms to 4600 angstroms.

* * * * *